(12) United States Patent
Lu et al.

(10) Patent No.: US 7,651,587 B2
(45) Date of Patent: Jan. 26, 2010

(54) TWO-PIECE DOME WITH SEPARATE RF COILS FOR INDUCTIVELY COUPLED PLASMA REACTORS

(75) Inventors: Siqing Lu, San Jose, CA (US); Qiwei Liang, Fremont, CA (US); Canfeng Lai, Fremont, CA (US); Robert T. Chen, Fremont, CA (US); Jason T. Bloking, Mountain View, CA (US); Irene Chou, San Jose, CA (US); Steven H. Kim, Union City, CA (US); Young S. Lee, Santa Clara, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 287 days.

(21) Appl. No.: 11/202,043

(22) Filed: Aug. 11, 2005

(65) Prior Publication Data
US 2007/0037397 A1 Feb. 15, 2007

(51) Int. Cl.
*C23C 16/00* (2006.01)
*H01L 21/306* (2006.01)
(52) U.S. Cl. .................. 156/345.48; 118/723 I; 118/723 AN; 118/715; 156/345.49; 156/345.33
(58) Field of Classification Search ............... 118/723 I, 118/723 IR, 723 AN, 712, 715; 156/345.26, 156/345.33, 345.48, 345.49; 315/111.51
See application file for complete search history.

(56) References Cited
U.S. PATENT DOCUMENTS 3,281,613 A 10/1966 Hatschek
4,591,627 A 5/1986 Maruno et al.
4,885,661 A 12/1989 Yokotani et al.
4,887,186 A 12/1989 Takeda et al.

(Continued)

FOREIGN PATENT DOCUMENTS

EP 0094078 A2 11/1983

(Continued)

OTHER PUBLICATIONS

Meziani et al., "Design of a magnetic-pole enhanced inductively coupled plasma source", Plasma Sources Sci. Technol. 10 (2001), pp. 276-283.*

(Continued)

*Primary Examiner*—Luz L. Alejandro
(74) *Attorney, Agent, or Firm*—Townsend and Townsend and Crew LLP (57) ABSTRACT

A substrate processing system has a housing that defines a process chamber, a gas-delivery system, a high-density plasma generating system, a substrate holder, and a controller. The housing includes a sidewall and a dome positioned above the sidewall. The dome has physically separated and noncontiguous pieces. The gas-delivery system introduces e a gas into the process chamber through side nozzles positioned between two of the physically separated and noncontiguous pieces of the dome. The high-density plasma generating system is operatively coupled with the process chamber. The substrate holder is disposed within the process chamber and supports a substrate during substrate processing. The controller controls the gas-delivery system and the high-density plasma generating system.

15 Claims, 6 Drawing Sheets

U.S. PATENT DOCUMENTS

| | | | |
|---|---|---|---|
| 4,978,881 A | | 12/1990 | Wakita et al. |
| 4,990,229 A | * | 2/1991 | Campbell et al. ...... 204/298.06 |
| 5,001,113 A | | 3/1991 | Williams et al. |
| 5,113,566 A | | 5/1992 | Weekamp et al. |
| 5,365,057 A | | 11/1994 | Morley et al. |
| 5,401,350 A | | 3/1995 | Patrick et al. |
| 5,522,934 A | | 6/1996 | Suzuki et al. |
| 5,556,501 A | * | 9/1996 | Collins et al. ......... 156/345.38 |
| 5,614,044 A | | 3/1997 | Nagayama et al. |
| 5,614,055 A | | 3/1997 | Fairbairn et al. |
| 5,865,896 A | | 2/1999 | Nowak et al. |
| 6,013,155 A | * | 1/2000 | McMillin et al. ....... 156/345.33 |
| 6,030,486 A | * | 2/2000 | Loewenhardt et al. . 156/345.46 |
| 6,054,013 A | * | 4/2000 | Collins et al. ......... 156/345.27 |
| 6,095,083 A | | 8/2000 | Rice et al. |
| 6,143,078 A | * | 11/2000 | Ishikawa et al. ............ 118/715 |
| 6,170,428 B1 | | 1/2001 | Redeker et al. |
| 6,182,602 B1 | | 2/2001 | Redeker et al. |
| 6,286,451 B1 | | 9/2001 | Ishikawa et al. |
| 6,308,654 B1 | * | 10/2001 | Schneider et al. ......... 118/723 I |
| 6,321,681 B1 | * | 11/2001 | Colpo et al. ............. 118/723 I |
| 6,444,085 B1 | * | 9/2002 | Collins et al. ............ 156/345.1 |
| 6,589,610 B2 | * | 7/2003 | Li et al. ...................... 427/569 |
| 2003/0213562 A1 | * | 11/2003 | Gondhalekar et al. .. 156/345.48 |
| 2006/0075967 A1 | * | 4/2006 | Lu et al. ................... 118/723 I |
| 2006/0177600 A1 | * | 8/2006 | Lu et al. ..................... 427/571 |

FOREIGN PATENT DOCUMENTS

| | | |
|---|---|---|
| EP | 0113999 A1 | 7/1984 |
| EP | 0190574 A2 | 8/1986 |
| EP | 0350941 A2 | 1/1990 |
| EP | 0660449 A2 | 6/1995 |
| EP | 0668608 A1 | 8/1995 |
| EP | 0697467 A1 | 2/1996 |
| EP | 0838843 A2 | 4/1998 |
| JP | 58196069 | 11/1983 |
| JP | 58196070 | 11/1983 |
| JP | 60229380 | 11/1985 |
| WO | WO97/03224 | 1/1997 |

OTHER PUBLICATIONS

U.S. Appl. No. 08/712,724, filed Sep. 11, 1996, Ishikawa.
U.S. Appl. No. 08/574,839, filed Dec. 19, 1995, Ishikawa.
PCT International Search Report and Written Opinion mailed Jan. 26, 2007; International Application No. PCT/US06/029763, 13 pages.

* cited by examiner

TWO-PIECE DOME WITH SEPARATE RF COILS FOR INDUCTIVELY COUPLED PLASMA REACTORS

BACKGROUND OF THE INVENTION

One of the primary steps in the fabrication of modern semiconductor devices is the formation of a film, such as a silicon oxide film, on a semiconductor substrate. Silicon oxide is widely used as an insulating layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with an electrically insulative material to isolate the elements both physically and electrically. Such spaces are sometimes referred to herein as "gaps" or "trenches," and the processes for filling such spaces are commonly referred to in the art as "gapfill" processes. The ability of a given process to produce a film that completely fills such gaps is thus often referred to as the "gapfill ability" of the process, with the film described as a "gapfill layer" or "gapfill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gapfill abilities. One family of electrically insulating films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gapfill layers. Such systems form a plasma that has a density greater than about $10^{11}$ ions/cm$^3$, which is about two orders of magnitude greater than the plasma density provided by a standard capacitively coupled plasma CVD system. Inductively coupled plasma ("ICP") systems are examples of HDP-CVD systems. One factor that allows films deposited by such HDP-CVD techniques to have improved gapfill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gapfill ability.

Even with the use of HDP and ICP processes, there remain a number of persistent challenges in achieving desired deposition properties. These include the need to manage thermal characteristics of the plasma within a processing chamber, particularly with high-energy processes that may result in temperatures that damage structures in the chamber. In addition, there is a general desire to provide deposition processes that are uniform across a wafer. Nonuniformities lead to inconsistencies in device performance and may result from a number of different factors. The deposition characteristics at different points over a wafer result from a complex interplay of a number of different effects. For example, the way in which gas is introduced into the chamber, the level of power used to ionize precursor species, the use of electrical fields to direct ions, and the like, may ultimately affect the uniformity of deposition characteristics across a wafer. In addition, the way in which these effects are manifested may depend on the physical shape and size of the chamber, such as by providing different diffusive effects that affect the distribution of ions in the chamber.

There is accordingly a general need in the art for improved systems for improving deposition uniformity across a wafer in HDP and ICP processes.

BRIEF SUMMARY OF THE INVENTION

Embodiments of the invention provide improved deposition processes under certain processing conditions, particularly under processing conditions where material is deposited with an inductively coupled plasma system under high energy conditions and over extended time periods. Such embodiments provide improved thermal control, a more diffusive gas flow within a process chamber, and improved plasma uniformity under such processing conditions by using a multi-piece dome as part of the process chamber.

A substrate processing system is provided with a housing that defines a process chamber, a gas-delivery system, a high-density plasma generating system, a substrate holder, and a controller. The housing includes a sidewall and a dome positioned above the sidewall. The dome has a plurality of physically separated and noncontiguous pieces. The gas-delivery system is configured to introduce a gas into the process chamber through side nozzles positioned between two of the physically separated and noncontiguous pieces of the dome. The high-density plasma generating system is operatively coupled with the process chamber. The substrate holder is disposed within the process chamber and configured to support a substrate during substrate processing. The controller controls the gas-delivery system and the high-density plasma generating system.

In some embodiments, the plurality of physically separated and noncontiguous pieces consist of two physically separated and noncontiguous pieces. The side nozzles may be adapted to provide a variable angle for directing the gas into the process chamber.

In addition to delivery of gas through side nozzles, the gas-delivery system may be configured to introduce a gas into the process chamber through a top nozzle through a first of the physically separated and noncontiguous pieces. The high-density plasma generating system may comprise an inductively driven RF coil disposed circumferentially about a second of the physically separated and noncontiguous pieces different from the first of the physically separated and noncontiguous pieces. In addition, the high-density plasma generating system may further comprise an inductively driven top RF coil disposed relatively proximate to the first of the physically separated and noncontiguous pieces.

In certain instances, the high-density plasma generating system may comprise magneto-dielectric material proximate the side RF coil for concentrating a magnetic field generated by the side RF coil. In one embodiment, the magneto-dielectric material comprises a ferromagnetic material and a dielectric material, the dielectric material provided at greater than 2 wt. % of the magneto-dielectric material, and has a relative permeability greater than 14.

In other instances, a magnetic confinement ring having a plurality of magnetic dipoles may be disposed circumferentially around the process chamber. For example, the magnetic confinement ring may be disposed circumferentially about one of the plurality of physically separated and noncontiguous pieces.

A further understanding of the nature and advantages of the present invention may be realized by reference to the remaining portions of the specification and the drawings.

DETAILED DESCRIPTION OF THE INVENTION

1. Overview

Embodiments of the invention provide an ICP reactor that has a multi-piece dome. When the inventors were initially confronted with the problem of improving deposition uniformity in ICP applications, they began by considering a number of different sources for nonuniformities and undertook a variety of studies to understand how these sources contributed to the resultant nonuniformity. These studies included both simulation and experimental studies. In particular, three principal classes of factors were identified as bearing on uniformity characteristics: plasma characteristics, chamber flow distributions, and thermal effects.

For example, in gapfill applications, better overall gapfill is achieved with higher ion densities in the plasma. Similarly, improved center-to-edge uniformity across a wafer is achieved when the ion distribution in the chamber has better uniformity. One reason that many ICP and HDP chambers have both top and side RF coils has been to try to improve the uniformity of the ion distribution in the chamber. It is generally expected that the effect of a top coil is to produce a plasma density that is greater at the center of the wafer and lower at the edge of the wafer, and that the opposite effect should result from side coils.

The chamber flow distributions are generally dictated by the location of gas nozzles that introduce precursor into the chamber, and by the presence of structure within the chamber that may affect flow characteristics, such as baffle structures and the like. In addition, the rates at which precursor gases are provided to the chamber through the nozzles affect the flow characteristics. One measure in which the variation in flow characteristics is evident is in the variation of a deposition/sputter ratio across the wafer. The deposition/sputter ratio is one of several commonly used measures that quantify high-density plasma processes according to the relative contributions of the simultaneous deposition and sputtering components of the process. Characterization of the plasma as a "high-density" plasma means that the average ion density of the plasma is greater than about $10^{11}$ ions/cm$^3$, with the deposition/sputter ratio being defined as:

$$\frac{D}{S} \equiv \frac{(\text{net deposition rate}) + (\text{blanket sputtering rate})}{(\text{blanket sputtering rate})}.$$

The deposition/sputter rate increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of high-density plasma processes, as is known to those of skill in the art. A common alternative ratio is the "etching/deposition ratio,"

$$\frac{E}{D} \equiv \frac{(\text{source-only deposition rate}) - (\text{net deposition rate})}{(\text{source-only deposition rate})},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

Thermal effects influence uniformity because they are directly related to the kinetic energy of the ionic species and therefore affect both the deposition/sputter ratio of the plasma and affect diffusive characteristics of the plasma. The temperature within the chamber is often chosen to be consistent with performance criteria defined by the chemical properties of the precursor gases used for the process so that different processes may have different uniformity concerns. For instance, gapfill processes are frequently used for the deposition of silicon oxide by providing precursor flows of monosilane $SiH_4$ and molecular oxygen $O_2$ to the chamber with a fluent gas. Depending on the physical structures of the gaps to be filled, including their separations, aspect ratios, and the like, different fluent gases may be preferred. For instance, some processes use a relatively heavy gas like Ar while other processes use lighter gases such as He and/or $H_2$, as described in commonly assigned U.S. patent application Ser. No. 10/137,132, entitled "METHOD FOR HIGH ASPECT RATIO HDP CVD GAPFILL," filed Apr. 30, 2002 by Zhong Qiang Hua et al. and commonly assigned U.S. patent application Ser. No. 10/350,445, entitled "HYDROGEN ASSISTED HDP-CVD DEPOSITION PROCESS FOR AGGRESSIVE GAP-FILL TECHNOLOGY," filed Jan. 23, 2003 by Bikram Kapoor et al., the entire disclosures of both of which are herein incorporated by reference for all purposes. Processes that use lighter fluent gases like $H_2$ tend to use higher chamber temperatures, leading to different kinetic characteristics of the plasma ions and affecting the wafer uniformity of the process.

As illustrated below, the inventors have found that the temperatures desired to implement certain deposition processes result in temperatures sufficiently high to damage portions of an ICP chamber, particularly the ceramic dome at the top of the chamber. This has been observed, for instance, with processes that provide source RF power greater than about 12 kW. One way that the inventors have identified for managing the thermal characteristics within the ICP chamber is to provide a multi-piece dome, with certain embodiments being directed particularly to a two-piece having portions separated by a gas ring having gas nozzles through which gases are introduced to the chamber. Such a configuration also results in providing a more diffusive gas flow in the ICP chamber and a more uniform plasma, improving the overall deposition characteristics. In some instances, a magnetic-field concentrator is additionally included, as may also be a magnetic confinement ring to improve the plasma uniformity further.

Embodiments of the invention are described in detail below, beginning with a detailed description of an exemplary ICP chamber. The temperature behavior of the dome when such an exemplary ICP chamber is provided as a conventional single-piece dome are discussed and modifications that introduce a multi-piece dome, together with a magnetic-field concentrator and/or a magnetic confinement ring, are illustrated. Simulation and experimental results illustrating the physical consequences on deposition processes of such a modified configuration are then presented.

2. Exemplar ICP Chamber

Figure 1:
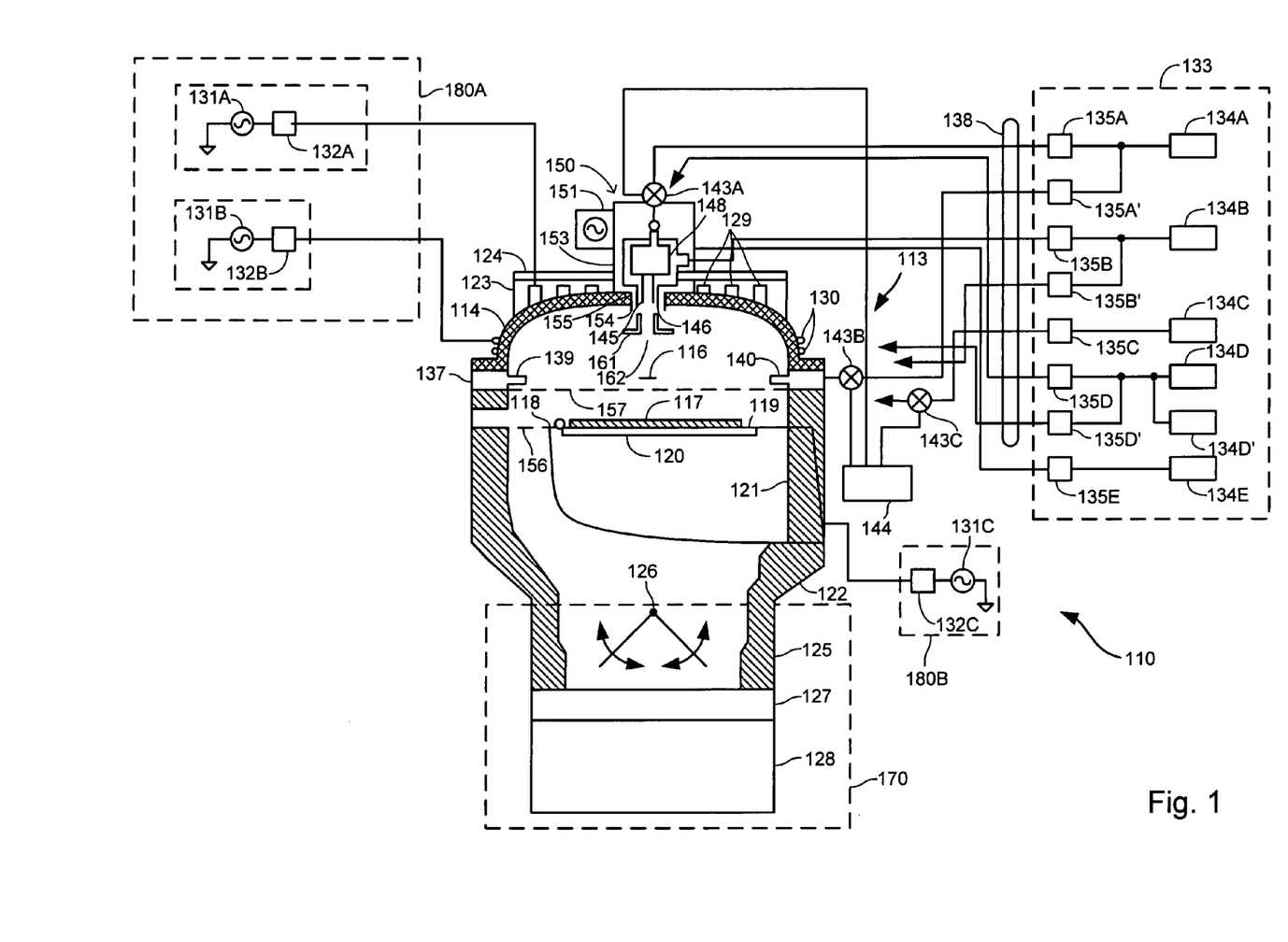
FIG. 1 is a simplified cross-sectional view of an exemplary ICP reactor system.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the ICP reactor is provided in connection with FIG. 1 below. The ICP reactor is part of an HDP-CVD system 110 that includes a chamber 113, a vacuum system 170, a source plasma system 180A, a bias plasma system 180B, a gas delivery system 133, and a remote plasma cleaning system 150. The upper portion of chamber 113 includes a dome 114, which is made of a ceramic dielectric material, such as aluminum oxide or aluminum nitride. Dome 114 defines an upper boundary of a plasma processing region 116 and is provided as a single-piece dome for conventional systems as illustrated in FIG. 1. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and small-molecule-enhanced turbomolecular pump 128. As described in detail below, the turbomolecular pump 128 has the modified performance characteristics making it suitable for efficient exhaustion of low-mass molecular species. It should be noted that throttle body 125 offers minimum obstruction to gas flow, and allows symmetric pumping. Gate valve 127 can isolate pump 128 from throttle body 125, and can also control chamber pressure by restricting the exhaust flow capacity when throttle valve 126 is fully open. The arrangement of the throttle valve, gate valve, and small-molecule-enhanced turbomolecular pump allow accurate and stable control of chamber pressures from between about 2 millitorr to about 2 torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 180B includes a bias RF ("BRF") generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 133 provides gases from several sources, 134A-134E chamber for processing the substrate via gas delivery lines 138 (only some of which are shown). As would be understood by a person of skill in the art, the actual sources used for sources 134A-134E and the actual connection of delivery lines 138 to chamber 113 varies depending on the deposition and cleaning processes executed within chamber 113. Gases are introduced into chamber 113 through a gas ring 137 and/or a top nozzle 145. A plurality of source gas nozzles 139 (only one of which is shown in the illustration) provide a uniform flow of gas over the substrate. Nozzle length and nozzle angle may be changed to allow tailoring of the uniformity profile and gas utilization efficiency for a particular process within an individual chamber. In one embodiment, twelve source gas nozzles made from an aluminum oxide ceramic are provided.

In addition, a plurality of oxidizer gas nozzles 140 (only one of which is shown), which in a preferred embodiment are co-planar with and shorter than source gas nozzles 139. In some embodiments it is desirable not to mix source gases and oxidizer gases before injecting the gases into chamber 113. In other embodiments, oxidizer gas and source gas may be mixed prior to injecting the gases into chamber 113. In one embodiment, third, fourth, and fifth gas sources, 134C, 134D, and 134D', and third and fourth gas flow controllers, 135C and 135D', provide gas to body plenum via gas delivery lines 138. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from the delivery lines and to vent the delivery lines to vacuum foreline 144, for example. As shown in FIG. 1, other similar valves, such as 143A and 143C, may be incorporated on other gas delivery lines. Such three-way valves may be placed as close to chamber 113 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

The chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. In some embodiments, oxygen is not supplied to the chamber from any side nozzles. The gases supplied to top nozzle 145 and top vent 146 may be kept separate prior to flowing the gases into chamber 113, or the gases may be mixed in top plenum 148 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process. In FIG. 1, the plasma-cleaning system 150 is shown disposed above the chamber 113, although other positions may alternatively be used.

A baffle 161 may be provided proximate the top nozzle to direct flows of source gases supplied through the top nozzle into the chamber and to direct flows of remotely generated plasma. Source gases provided through top nozzle 145 are directed through a central passage 162 into the chamber, while remotely generated plasma species provided through the cleaning gas feed port 154 are directed to the sides of the chamber 113 by the baffle 161.

3. Dome Characteristics

Figure 2:
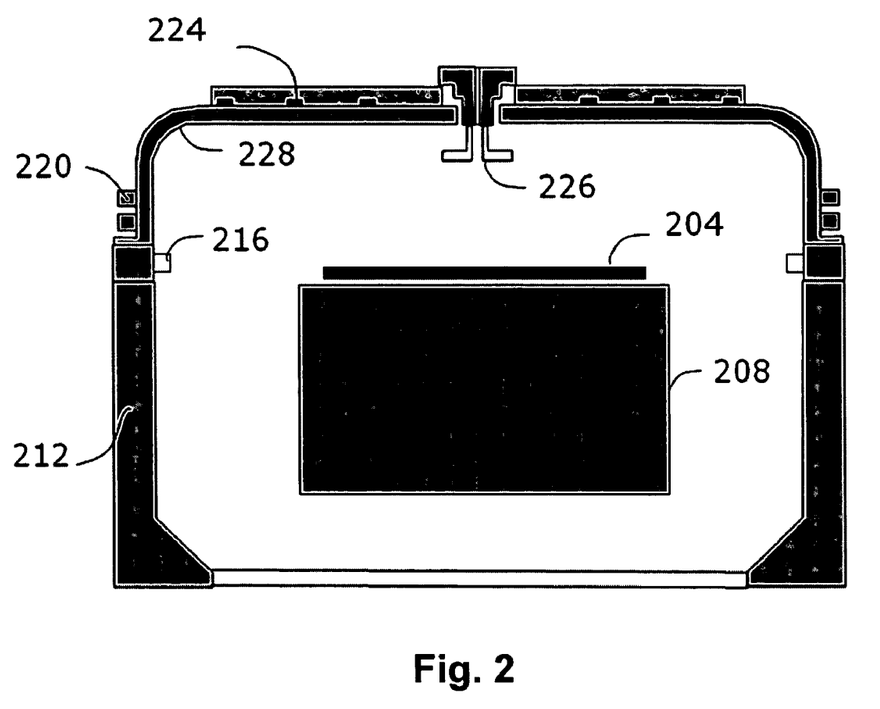
FIG. 2 is a schematic illustration of certain components of an ICP reactor system.

The relevant structural characteristics of the ICP system of FIG. 1 in discussing dome characteristics are presented in simplified form in FIG. 2. In this drawing the ICP chamber is defined generally by chamber walls 212 and chamber dome 228. A substrate 204 is disposed on a substrate support and may have material deposited on it from a plasma formed by inductive coupling of energy from side coil 220 and top coil 224 to gas supplied from side nozzles 216 and from a top nozzle through baffle 226. In response to finding that that the dome 228 in such a structure is subject to fracture for high-energy processes, such as where the side and top coils 220 and 224 collectively provide RF energy greater than about 12 kW, the inventors hypothesized that such fracture may be a consequence of thermal effects, particularly for relatively long-time processes.

Figure 3:
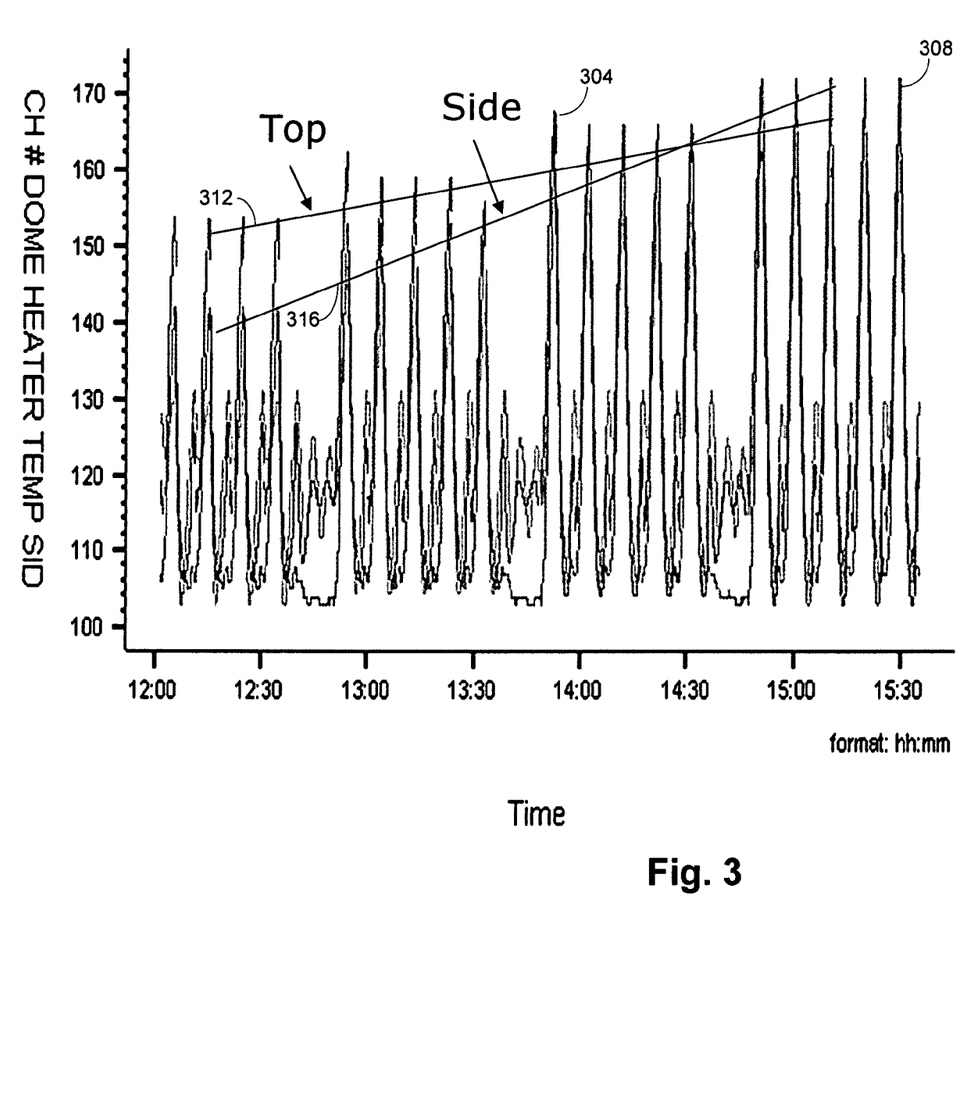
FIG. 3 provides data illustrating a temperature variation of a dome in a single-dome ICP reactor system.

Results of an experimental investigation are provided in FIG. 3. This graph plots the temperature of the top and side portions of the dome 228 over time during a deposition process. The process has a certain periodicity evident from the data collected for the top (curve 304) and for the side (curve 308), with a generally increasing trend superimposed over this periodicity. The superimposed trend is illustrated for the top of the dome 228 by curve 312 and for the side of the dome 228 by curve 316. This generally increasing trend is stronger for the side portion of the dome than for the top, illustrating a clear lack of cooling at the side of the dome. These results provide confirmation that thermal effects for long-time processes contribute to the observed dome fracture during high-power processes.

Figure 4:
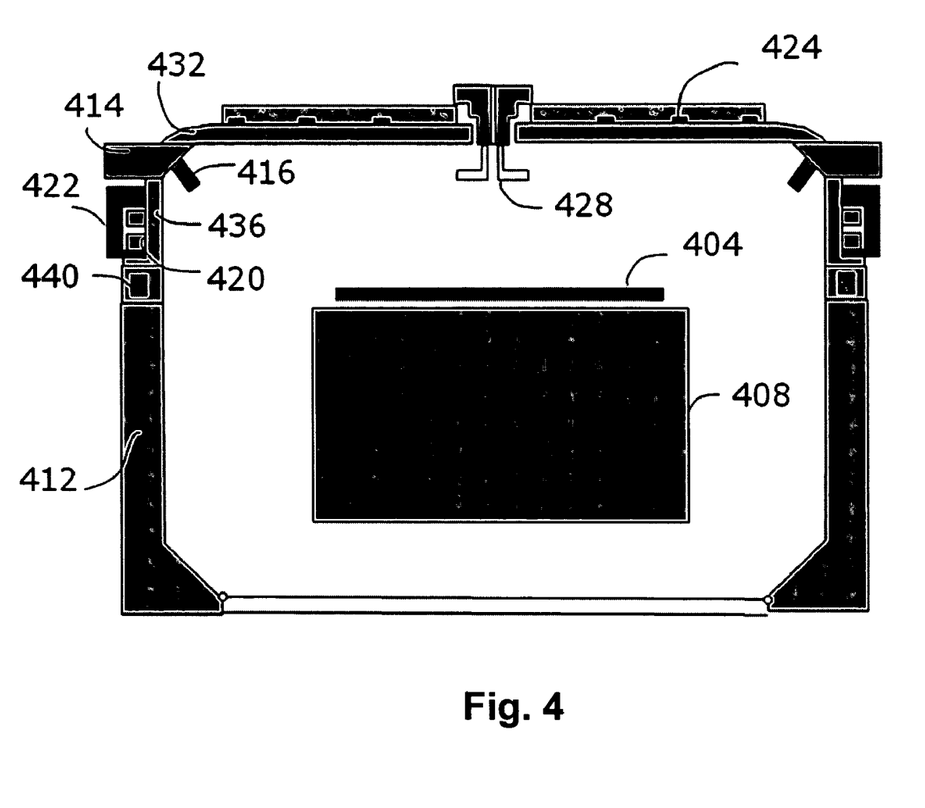
FIG. 4 is a schematic illustration illustrating aspects of an ICP reactor according to embodiments of the invention.

Improved thermal management, and therefore a decreased risk of fracture during such processes, may be achieved in embodiments of the invention by using a multi-piece dome, such as the two-piece dome illustrated in FIG. 4. In this embodiment, the ICP chamber has a substrate support 408 for supporting a substrate 404 within chamber walls 412. The two parts of the dome are denoted by reference numbers 432 and 436, and are separated by a gas ring 414 that is used to supply gases to the chamber through nozzles 416. The nozzles 416 may advantageously be configured to provide a variable angle so that flows into the process chamber may be directed differently for different processes. Gas may also be provided to the chamber via a top nozzle that directs gas into the chamber through a baffle 428. A plasma is generated inductively from the gas flows by coupling RF power from a side coil 420 and/or from a top coil 424.

Providing the dome in multiple pieces in the manner illustrated in FIG. 4 advantageously improves thermal management of processes in the chamber. Experiments performed by the inventors have confirmed that even with source RF powers provided by the side and top coils 420 and 424 to exceed 12 kW, fracture of the dome may be avoided. The positioning of the side nozzles 416 in this fashion is generally farther from the substrate 404 than in the design illustrated in FIG. 2, with a consequence that the multi-piece dome configuration provides a more diffusive flow within the processing chamber. In addition, the plasma uniformity is improved, resulting in generally improved deposition characteristics. In addition, the configuration shown in FIG. 4 provides the side RF coils 420 at a position that is closer to the substrate 404 surface when compared with the configuration of FIG. 2; as illustrated in the discussion below, this provides improved plasma uniformity at the substrate 404 surface.

In some embodiments, use the multi-piece dome may be coupled with other mechanisms that may also improve plasma uniformity and/or the diffusivity of the gas flow within the processing chamber. For instance, the inductive RF coupling may be enhanced by providing a magnetic-field concentrator 420 disposed proximate the side coil 420. The use of such a magnetic-field concentrator 420 is described in further detail in copending, commonly assigned U.S. patent application Ser. No. 10/963,030, entitled "MAGNETIC-FIELD CONCENTRATION IN INDUCTIVELY COUPLED PLASMA REACTORS," filed Oct. 12, 2004 by Siqing Lu et al., the entire disclosure of which is incorporated herein by reference. Briefly, such a magnetic-field concentrator 420 may comprise a magneto-dielectric material that acts to concentrate the magnetic field generated by the side coil 420. In some embodiments, the magneto-dielectric material comprises a ferromagnetic material and a dielectric material, with the dielectric material being provided at greater than 2 wt. % of the magneto-dielectric material.

The ICP system may also include a magnetic confinement ring 440 disposed circumferentially about one of the pieces of the dome, preferably around the lower piece of the dome. The use of such a magnetic-confinement ring is described in detail in U.S. patent application Ser. No. 11/053,363, entitled "INDUCTIVE PLASMA SYSTEM WITH SIDEWALL MAGNET," filed Feb. 8, 2005 by Siqing Lu et al., the entire disclosure of which is incorporated herein by reference for all purposes. In some embodiments, the magnetic confinement ring may have a plurality of magnetic dipoles disposed circumferentially around a symmetry axis orthogonal to a plane of the substrate, and may provide magnetic field with a net dipole moment substantially nonparallel with the substrate plane.

Figure 5:
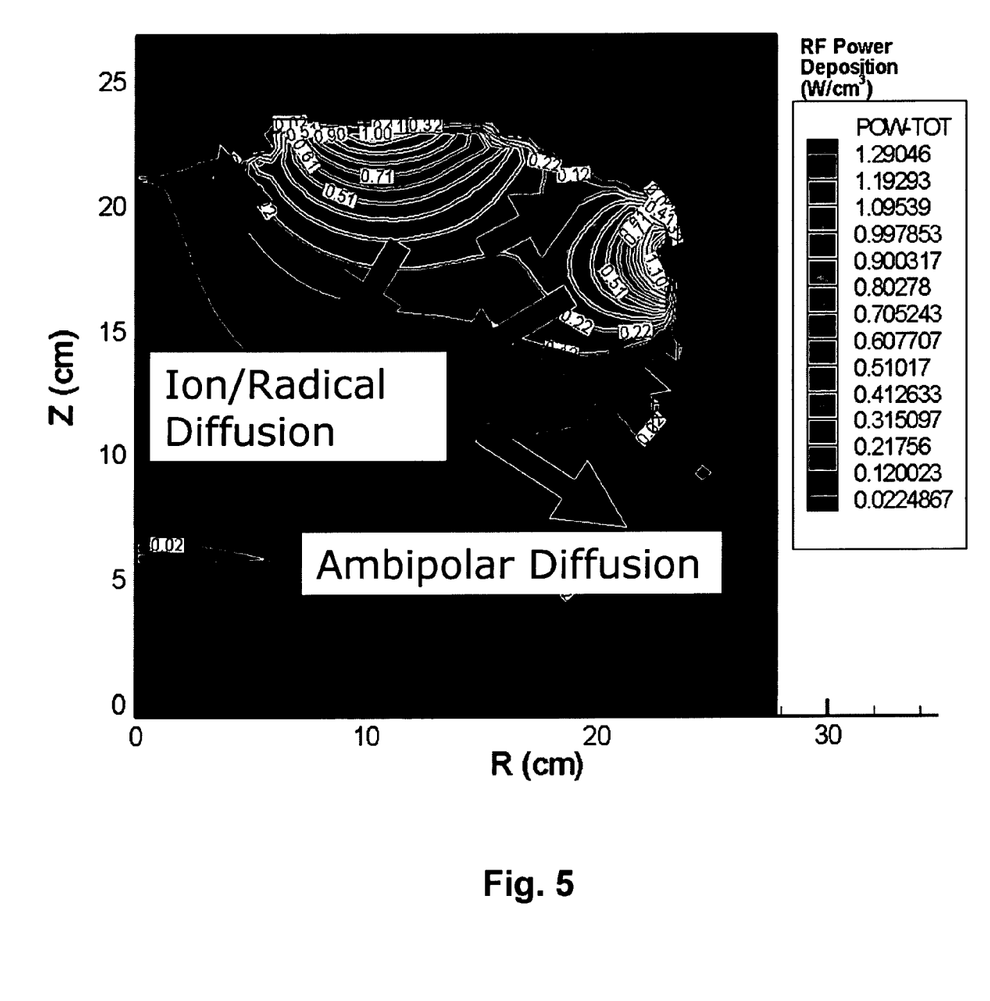
FIG. 5 provides simulation results of plasma distribution in an ICP reactor according to embodiments of the invention.

The combination of these different mechanisms may improve both the diffusivity of the flow within the process chamber and may improve the plasma uniformity, leading to improvements in deposition quality. The inventors have evaluated these factors through simulations and through experimental measurements, with some results being presented in FIGS. 5 and 6. FIG. 5A shows the results of a simulation of RF power density within the plasma as inductively coupled within the chamber. Power levels are identified by the legend at the right of the plot and by numerical values indicated for contours on the plot. The top and side sources are evident in the results of the simulation as high-power origins at the top and right side of the result. Diffusion characteristics resulting from the plasma-power distribution are indicated with arrows, including both ion and radical diffusion as well as ambipolar diffusion. As previously intimated, the change in position of the side coils 420 in the two-piece dome configuration to be closer to the substrate 404 surface results in improved plasma uniformity at the substrate 404 surface.

Figure 6:
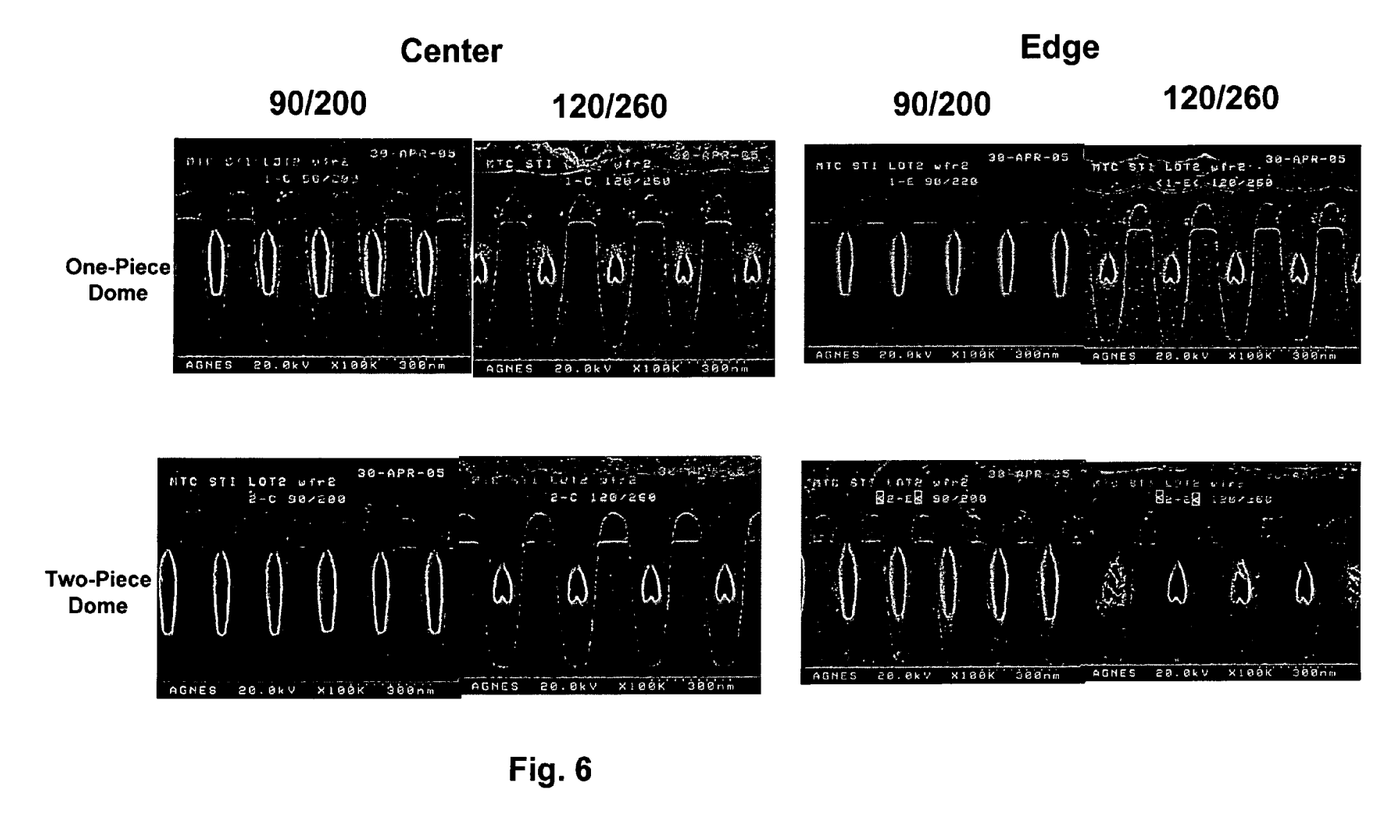
FIG. 6 provides SEM views of structures comparing gapfill characteristics of ICP reactors.

Deposition performance using the one-piece and two-piece domes was compared by performing a gapfill test on a substrate. A silicon oxide layer was deposited using flows of $SiH_4$, $O_2$, and $H_2$ under conditions that provided a D/S ratio of 9.5 and a net deposition rate of 670 Å/min. In FIG. 6, the top panels show SEM photographs for the one-piece dome and the bottom panels show SEM photographs for the two-piece dome; the left panels provide SEM photographs taken at the center of the substrate while the right panels provide photographs taken at the edge of the substrate. Clipping is observed for the one-piece dome chamber at the center of the substrate, but no such clipping is observed for the two-piece dome, confirming that improved gapfill uniformity may be achieved with the multi-piece dome configuration.

Having fully described several embodiments of the present invention, many other equivalents or alternative embodiments of the present invention will be apparent to those skilled in the art. The scope of the invention should, therefore, be determined not with reference to the above description, but instead should be determined with reference to the appended claims along with their full scope of equivalents.

What is claimed is:

1. A substrate processing system comprising:
    a housing defining a process chamber, the housing including a sidewall and a dome positioned above the sidewall, the dome having a plurality of physically separated and noncontiguous pieces;
    a gas-delivery system configured to introduce a gas into the process chamber through side nozzles positioned between two of the physically separated and noncontiguous pieces of the dome;
    a magnetic confinement ring having a plurality of magnetic dipoles disposed circumferentially around the process chamber and physically separating the sidewall from the dome;
    a high-density plasma generating system operatively coupled with the process chamber;
    a substrate holder disposed within the process chamber and configured to support a substrate during substrate processing; and
    a controller for controlling the gas-delivery system and the high-density plasma generating system.

2. The substrate processing system recited in claim 1 wherein the plurality of physically separated and noncontiguous pieces consists of two physically separated and noncontiguous pieces.

3. The substrate processing system recited in claim 1 wherein the gas delivery system is further configured to introduce a gas into the process chamber through a top nozzle through a first of the physically separated and noncontiguous pieces.

4. The substrate processing system recited in claim 3 wherein the high-density plasma generating system comprises an inductively driven side RF coil disposed circumferentially about a second of the physically separated and noncontiguous pieces different from the first of the physically separated and noncontiguous pieces.

5. The substrate processing system recited in claim 4 wherein the high-density plasma generating system further comprises an inductively driven top RF coil disposed relatively proximate to the first of the physically separated and noncontiguous pieces.

6. The substrate processing system recited in claim 1 wherein the high-density plasma generating system comprises an inductively driven side RF coil disposed circumferentially about one of the physically separated and noncontiguous pieces.

7. The substrate processing system recited in claim 6 wherein the high-density plasma generating system comprises magneto-dielectric material proximate the side RF coil for concentrating a magnetic field generated by the side RF coil.

8. The substrate processing system recited in claim 7 wherein the magneto-dielectric material comprises a ferromagnetic material and a dielectric material, the dielectric material provided at greater than 2 wt. % of the magneto-dielectric material, and has a relative permeability greater than 14.

9. The substrate processing system recited in claim 1 wherein the magnetic confinement ring is disposed circumferentially about one of the plurality of physically separated and noncontiguous pieces.

10. The substrate processing system recited in claim 1 wherein the side nozzles are adapted to provide a variable angle for directing the gas into the process chamber.

11. A substrate processing system comprising:
    a housing defining a process chamber, the housing including a sidewall and a dome positioned above the sidewall, the dome having a plurality of physically separated and noncontiguous pieces;
    a high-density plasma generating system operatively coupled with the process chamber, the high-density plasma generating system comprising:
        an inductively driven top RF coil disposed relatively proximate to a first of the physically separated and noncontiguous pieces; and
        an inductively driven side RF coil disposed circumferentially about a second of the physically separated and noncontiguous pieces different from the first of the physically separated and noncontiguous pieces;
    a gas-delivery system configured to introduce a gas into the process chamber through a top nozzle through the first of the physically separated and noncontiguous pieces and through side nozzles positioned between the first and second physically separated and noncontiguous pieces;
    a magnetic confinement ring having a plurality of magnetic dipoles disposed circumferentially around the process chamber and physically separating the sidewall from the dome;
    a substrate holder disposed within the process chamber and configured to support a substrate during processing; and
    a controller for controlling the gas-delivery system and the high-density plasma generating system.

12. The substrate processing system recited in claim 11 wherein the high-density plasma generating system comprises magneto-dielectric material proximate the side RF coil for concentrating a magnetic field generated by the side RF coil.

13. The substrate processing system recited in claim 12 wherein the magneto-dielectric material comprises a ferromagnetic material and a dielectric material, the dielectric material provided at greater than 2 wt. % of the magneto-dielectric material, and has a relative permeability greater than 14.

14. The substrate processing system recited in claim 11 wherein the magnetic confinement ring is disposed circumferentially about the first of the physically separated and noncontiguous pieces.

15. The substrate processing system recited in claim 11 wherein the side nozzles are adapted to provide a variable angle for directing the gas into the process chamber.

* * * * *